United States Patent [19]

Crewe

[11] Patent Number: 5,150,001
[45] Date of Patent: * Sep. 22, 1992

[54] FIELD EMISSION ELECTRON GUN AND METHOD HAVING COMPLEMENTARY PASSIVE AND ACTIVE VACUUM PUMPING

[75] Inventor: Albert V. Crewe, Palos Park, Ill.

[73] Assignee: Orchid One Corporation, Palos Hills, Ill.

[*] Notice: The portion of the term of this patent subsequent to May 23, 2006 has been disclaimed.

[21] Appl. No.: 508,292

[22] Filed: Apr. 10, 1990

[51] Int. Cl.[5] .............................. H01J 7/18
[52] U.S. Cl. ...................... 313/7; 313/552; 313/558
[58] Field of Search ............ 313/7, 545, 552, 553, 313/558, 454, 455, 459, 460, 233

[56] References Cited

U.S. PATENT DOCUMENTS

| | | | |
|---|---|---|---|
| 3,678,333 | 7/1972 | Coates et al. | 315/31 |
| 3,881,125 | 4/1975 | Baker et al. | 313/237 |
| 4,833,362 | 5/1989 | Crewe | 313/7 |

FOREIGN PATENT DOCUMENTS

| | | |
|---|---|---|
| 0066409 | 12/1982 | European Pat. Off. |
| 0257394 | 3/1988 | European Pat. Off. |
| 52-49761 | 4/1977 | Japan |
| 8802180 | 3/1988 | PCT Int'l Appl. |
| 0754523 | 8/1980 | U.S.S.R. ............ 313/7 |
| 0909308 | 10/1962 | United Kingdom .... 313/7 |
| 2077487 | 12/1981 | United Kingdom |
| 2164788 | 3/1986 | United Kingdom .... 313/7 |

OTHER PUBLICATIONS

Giorgi et al., "An updated Review of Getters and Gettering", *Journal of Vacuum Science & Technology*, vol. 3, No. 2, Mar./Apr. 1985, pp. 417-423.

Crewe et al., "A High Resolution Scanng Transmission Microscope," *Journal of Applied Physics*, vol. 39, No. 13, Dec. 1968, pp. 5861-5868.

*Primary Examiner*—Leo H. Boudreau
*Assistant Examiner*—Andrew W. Johns

[57] ABSTRACT

An electron beam system comprises a vacuum enclosure, a source of electrons within the enclosure, and a passive pump located within or in communication with the enclosure for pumping gases from the enclosure. A supplemental active pump is coupled to the vacuum enclosure and functions simultaneously with the passive pump for pumping from the enclosure gases not removed, or not removed efficiently, therefrom by the passive pump.

3 Claims, 5 Drawing Sheets

FIELD EMISSION ELECTRON GUN AND METHOD HAVING COMPLEMENTARY PASSIVE AND ACTIVE VACUUM PUMPING

CROSS-REFERENCE TO RELATED APPLICATIONS

This application is related to, but in no way dependent upon, my co-pending application No. (508,293), filed Apr. 10, 1990.

BACKGROUND OF THE INVENTION

U.S. Pat. No. 4,833,362, entitled "Encapsulated High Brightness Electron Beam Source and System", describes a modular high brightness source for use in or with an electron beam systems such as electron microscopes, electron beam inspection systems, electron beam lithographic systems and the like. The source preferably includes a field emission cathode. The source includes source enclosure means which defines an ultra high vacuum enclosure for the field emission cathode. A lens system images the field emission tip on a differential pressure aperture which serves as an effective point source for the associated electron beam system. The source may be permanently built in or modular.

To pump the source vacuum enclosure to an ultra high vacuum level needed for a field emission cathode, the system uses a passive electron pump, preferably a non-evaporable porous getter. Tests have proven the source to have superior performance, reliability and cost effectiveness.

It has been found that the non-evaporable getter utilized in the above-described source is extremely effective in absorbing nearly all ambient gases, yet traces of hydrocarbons and inert gases such as argon are not absorbed, or are absorbed inefficiently, by the non-evaporable getter.

Argon is a component of natural atmosphere, but can also arise from such sources as gun weldments and ceramic gun components. Hydrocarbon gas from grease, oil and the like can be found almost anywhere in the atmosphere.

OBJECTS OF THE INVENTION

It is an object of the present invention to provide in or for a differential pressure electron beam system, an improved electron source and method of the general character described in U.S. Pat. No. 4,833,362 having an ultra high vacuum cathode and a non-evaporable porous getter. In particular, it is an object to provide such a source and method wherein cathode life is enhanced by the removal of gases not absorbed, or not absorbed efficiently, by the non-evaporable getter.

It is another object of the invention to thus enhance the cathode life of such a source without significantly increasing the cost thereof, and without impairing the modularity or other attributes thereof.

Prior Art

U.S. Pat. No. 4,833,362 - Crewe, and references cited therein.

U.S. Pat. No. 3,678,333 - Coates, et al

Appendage pumps, per se, are known in electron beam systems.

DESCRIPTION OF THE PREFERRED EMBODIMENT

Figure 1:
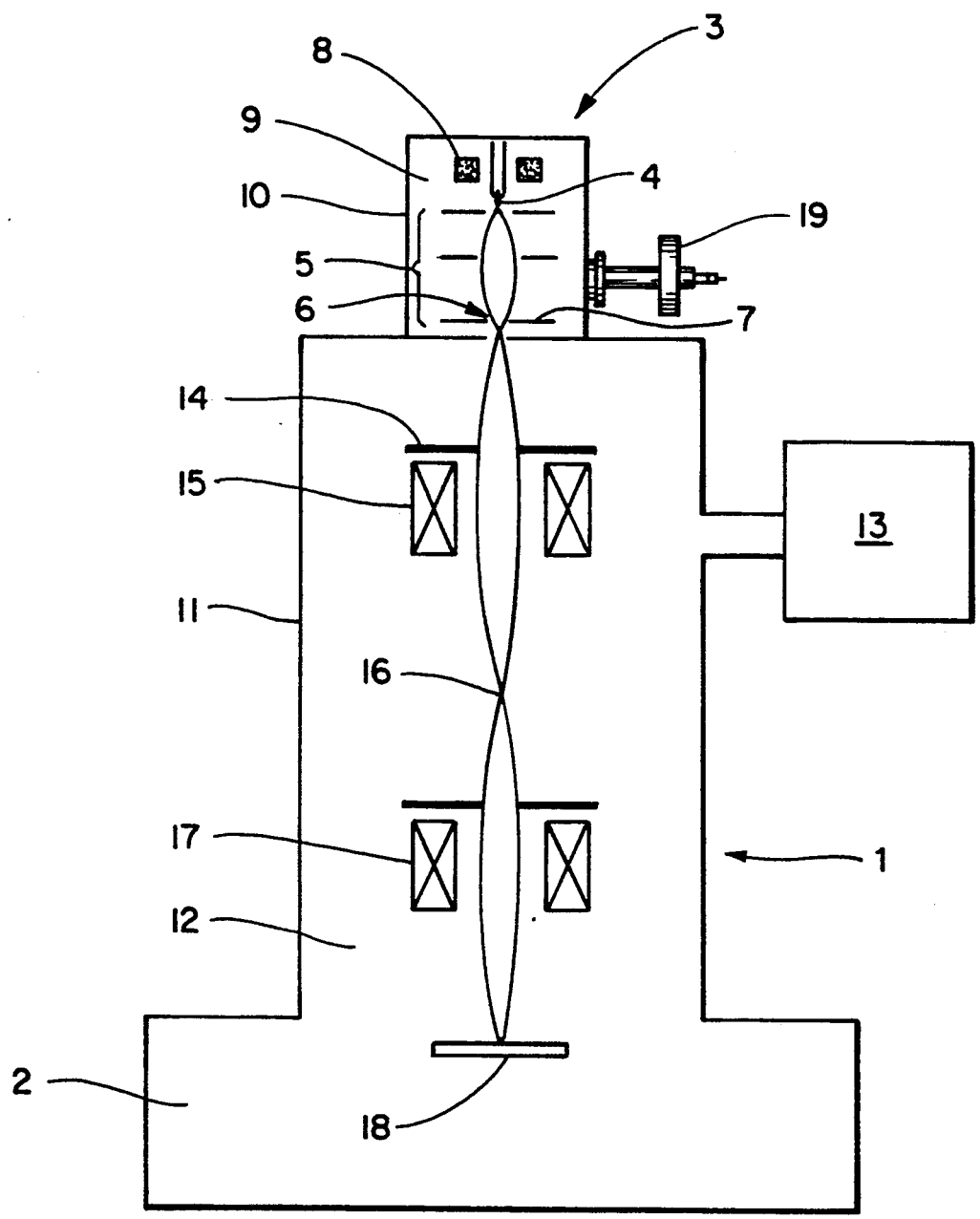
FIG. 1 is a highly schematic view of an electron microscope including an electron gun with which this invention may be employed.

The principles of this invention may be employed in connection with a variety of electron beam systems. FIG. 1 illustrates an electron beam microscope with which the present invention may be utilized. The FIG. 1 microscope is illustrated as comprising an electron beam column 1 and a specimen chamber 2. Mounted on the column 1 is an encapsulated high brightness electron source 3 which may be constructed in accordance with the teachings of my U.S. Pat. No. 4,833,362. The source 3 is illustrated as including a field emission tip 4 and an electrostatic lens 5 which forms an image of the tip 4 on axis in the vicinity of a differential pressure aperture 6 formed in a lens element 7 constituting part of the lens 5. A non-evaporable porous getter 8 is used to pump an ultra high vacuum enclosure 9 to ultra high vacuum levels suitable for operation of the field emission tip 4. Source vacuum enclosure means 10 defines the ultra high vacuum source enclosure 9.

FIG. 1 illustrates schematically a system vacuum enclosure means 11 which defines therewithin a system vacuum enclosure 12. A vacuum pump 13 illustrated schematically for pumping the system vacuum enclosure to suitable vacuum levels—typically $10^{-5}$ to $10^{-6}$ Torr. A stop 14 limits and defines the beam. A condenser lens is illustrated at 15 for forming an intermediate beam crossover 16. An objective lens 17 images the beam crossover 16 on a specimen supported by a specimen holder 18. The condenser lens 15 is shown for completeness although in many applications it may not be necessary.

An appendage pump 19 constituting part of the present invention is illustrated schematically at 19. It will be described in more detail hereinafter.

FIGS. 2-8 illustrate a high performance modular electron gun assembly implementing the teachings of the present invention and useful in or with electron beam systems such as electron microscopes, electron beam lithography systems, electron beam inspection systems, and other electron beam systems. The illustrated electron gun assembly represents an improvement in certain aspects of a high performance modular electron beam gun assembly described and claimed in U.S. Pat. No. 4,833,362, assigned to the assignee of the present invention.

For a general description of the features, benefits, advantages, functions and general structure of a high performance modular electron gun assembly having characteristics in common with the gun of this invention, reference may be made to U.S. Pat. No. 4,833,362.

Figure 1A:
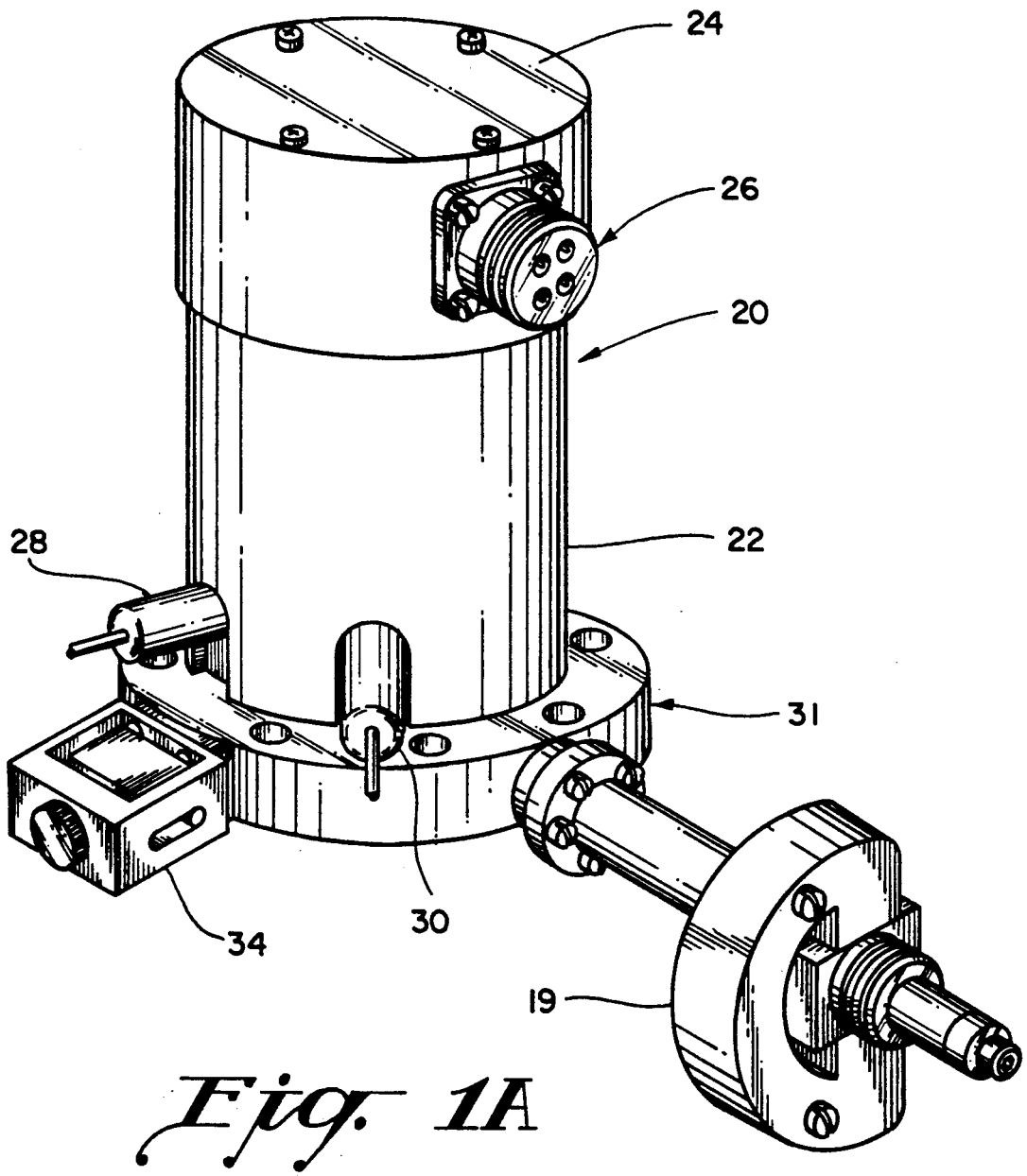
FIG. 1A is perspective view of the electron gun illustrated in FIG. 1.

FIG. 1A is a high performance modular electron gun assembly 20 (shown schematically as source 3 in FIG. 1). The gun assembly 20 is illustrated as comprising an outer shield taking the form of a shield body 22 and a shield cap 24.

A four pin electrical connector 26 is mounted on the shield cap 24. Two pins provide for electrical excitation of the gun tip filament, and two for extraction and focus electrodes. Feed-throughs 28, 30 are also coupled to the same extraction and focus electrodes, as will become evident. A valved flange assembly 31 includes a safety valve actuator 34 used in the evacuation and sealing of the electron gun assembly 20.

Figure 2:
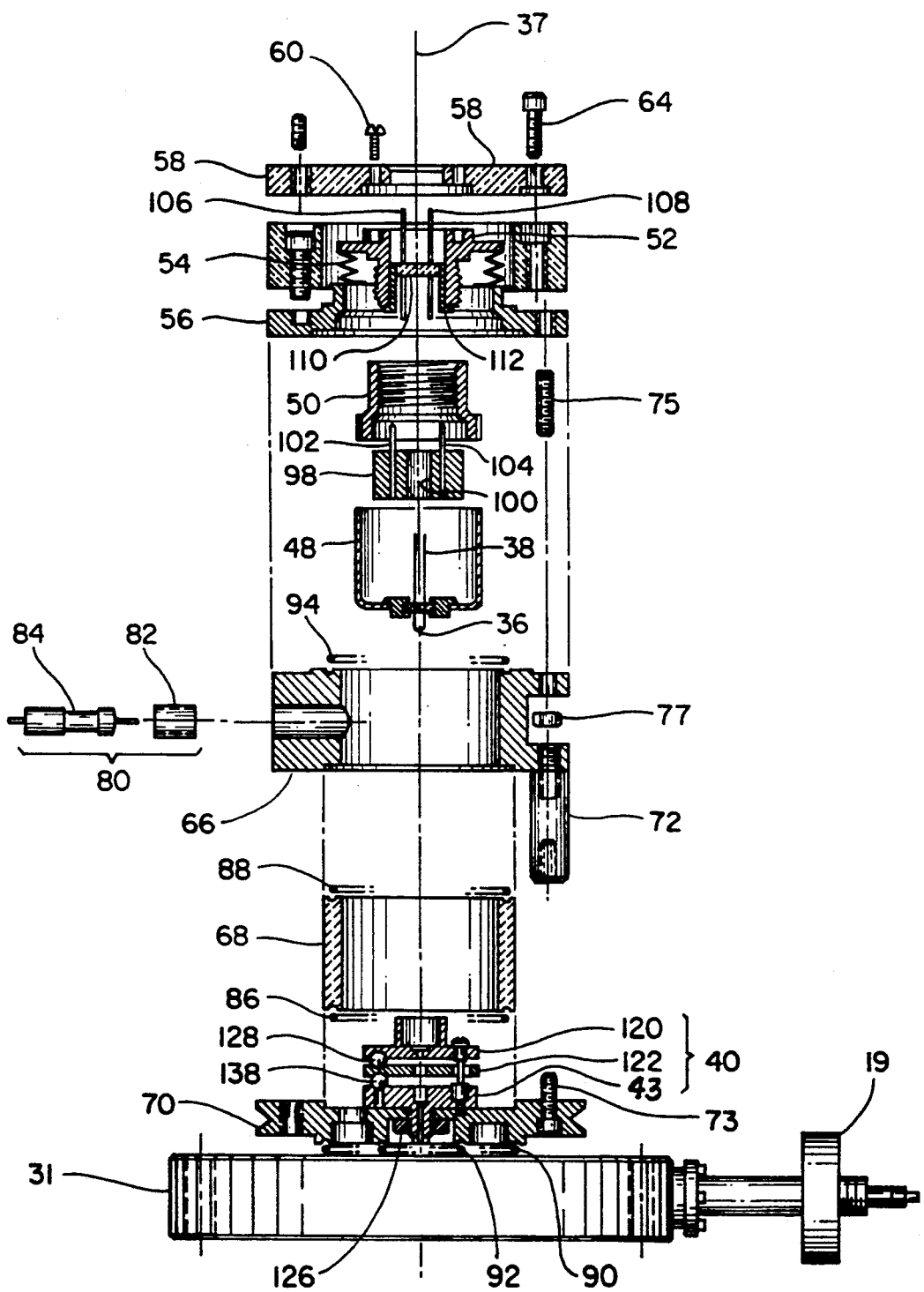
FIG. 2 is an exploded, partially sectioned view of a portion of the electron gun assembly shown in FIG. 1A.
Figure 3:
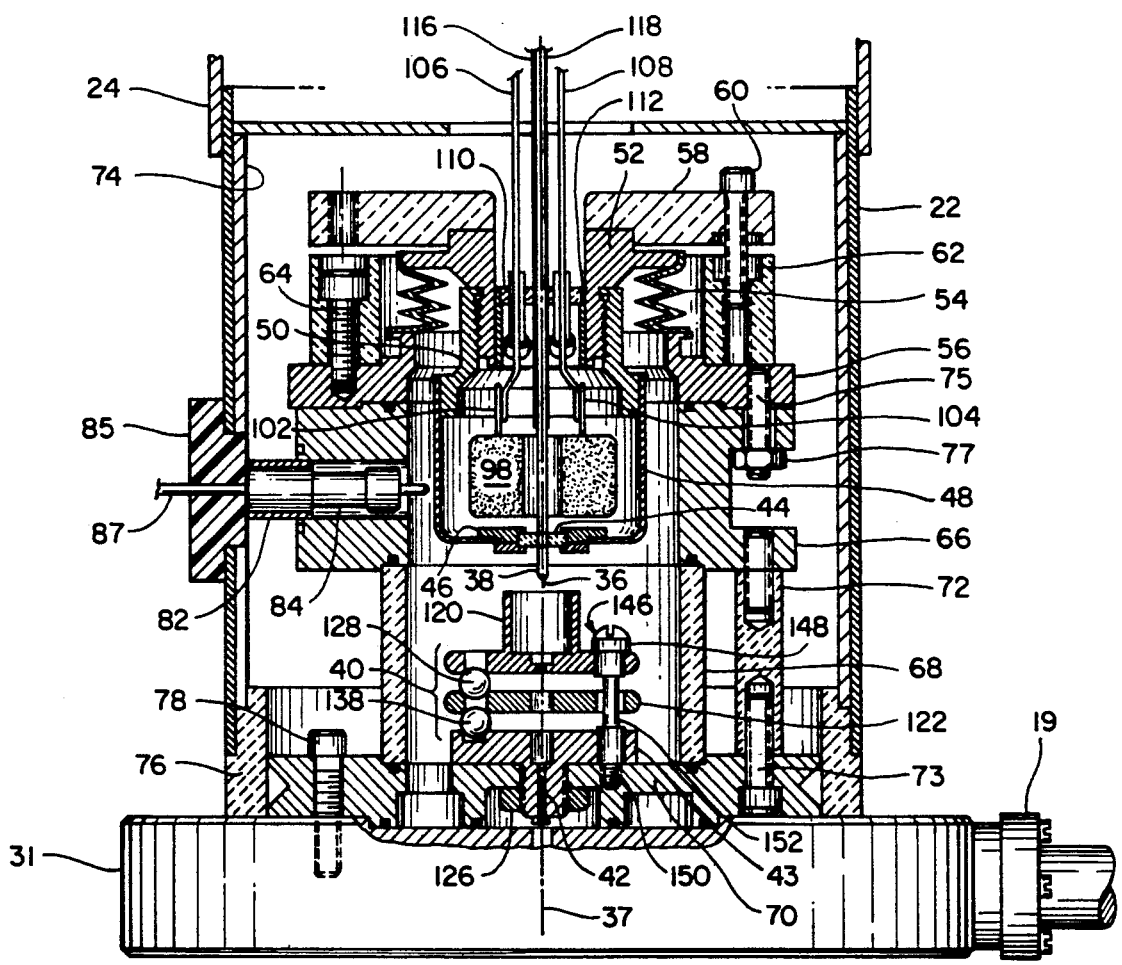
FIG. 3 is an assembled view of the electron gun assembly shown exploded in FIG. 2, including parts shown in FIG. 1A but omitted from FIG. 2.
Figure 4:
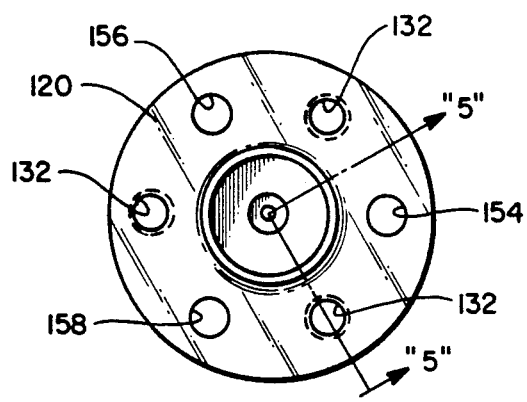
FIGS. 4 and 5 are plan and partial section views of an extraction electrode shown in the FIGS. 1A-3 gun assembly.

Referring to FIGS. 2 and 3, the gun assembly includes a cathode for establishing a source of electrons on a beam axis 37. The cathode is illustrated as being of the field emission type having a tip 36 (shown at 4 in FIG. 1) excited through a filament 38.

As will be described in more detail hereinafter, electrons generated by the tip 36 are extracted and focused by means of a three element lens 40 (5 in FIG. 1) which forms a beam focus at a differential pressure aperture 42 (6 in FIG. 1) in an anode electrode 43 (7 in FIG. 1), as will be described in more detail hereinafter. The beam focus at the differential pressure aperture 42 creates an effective point source of electrons for the electron beam system to which the gun assembly is attached or within which the electron gun assembly is incorporated.

Returning to a description of the field emission source, the filament 38 is supported in a ceramic disk 44 which in turn is held by a tip clamp assembly 46. The tip clamp assembly 46 is in turn mounted in a tip support bracket 48 held by a tip support collar 50. The collar 50 is supported by a mounting hub 52 connected by a welded-diaphragm bellows 54 to a top flange 56. The hub 52 is held in an alignment/insulator disk 58, as by means of screws 60. An alignment/insulator ring 62, which may be composed of Lexan, is affixed between the disk 58 and the top flange 56 by means of screws 64.

The field emission source and the above-described supporting apparatus is aligned and supported by a transition joint 66 which rests on a tube 68 of ceramic or glass surrounding the electrode assembly 40. The tube 68 is supported in a recess in a base plate 70. A series of azimuthally spaced insulative rods 72, preferably composed of Lexan, are held in place by screws 73. The rods 72 retain the tube 68 and couple the transition joint 66 to the base plate 70.

The gun subassembly described defines an ultra high vacuum enclosure suitable for operation of a field emission cathode. Surrounding the gun subassembly is a shield assembly including the exterior shield body 22 and shield cap 24, and an interior shield housing 74. The interior shield housing 74 and the shield body 22 are supported on a ceramic base ring 76. The entire subassembly is anchored with screws 78 to assembly 31. A feed-through assembly 80 passes a conductor 87 through the ultra high vacuum enclosure for exciting the electrode assembly 40. The feed-through assembly 80 is illustrated as including a feed-through mounting sleeve 82 welded in a bore in the transition joint 66. A ceramic-stainless steel feed-through 84 (30 in FIG. 1A) is welded in the sleeve 82. A similar feed-through angularly displaced from feed-through 84 is not shown in FIG. 2, but appears as element 28 in FIG. 1A.

Indium O-rings, shown at 86, 88, 90, 92 and 94 improve the hermetic sealing of the parts which define the ultra high vacuum enclosure. A Teflon plug 85 supports the feed-through conductor 87 in an opening through the shield body 22 and interior shield housing 74.

A non-evaporable porous getter 98 (8 in FIG. 1) is provided for pumping the ultra high vacuum enclosure. The getter 98 has a cylindrical opening 100 passing the filament 38. Getter heater terminals 102, 104 are electrically joined to and supported by conductors 106, 108. Conductors 106, 108 are supported by a ceramic disk 110 held by a sleeve 112 within the bore of mounting hub 52.

By way of illustration, the getter 98 may be a non-evaporable porous getter such as manufactured by SAES Getters S.p.A. of Milano, Italy. Such non-evaporable porous getters may use zirconium powder as the active material, sintered at a high temperature with graphite powder, conferring the required characteristics of high porosity and large surface area as well as good mechanical strength. In the use of such getters at high temperatures (for example, about 300 degrees C.), gas sorption is not limited to the surface of the zirconium grains but includes diffusion into the bulk, resulting in superior gettering action.

Getter 98 is illustrated as taking a toroidal form; other shapes are available and may be suitable depending upon the application. In order to activate the getter material, it must be heated under vacuum for a time sufficient to remove from the surface of the getter material the protective layer formed at room temperature during the first exposure to air at the end of the manufacturing process. Full activation of the getter material is obtained by heating the getter, e.g. under a vacuum of $10^{-3}$ Torr at 900 degrees C. for ten minutes. Other combinations of temperature and time are possible to produce complete activation. When only a limited activation time or a low heating temperature are possible, reasonable sorption characteristics can be achieved by a partial activation of the getter. Activation can also be achieved by intermittent heating of the gettering material, provided that the cumulative heating time is the same as that of a continuing activation. In this way, localized overheating of nearby parts can be minimized.

The pumping speed of non-evaporable porous getters of the type described tends to decrease with the progressive sorption of gaseous species until it eventually can become too low to cope with the degassing rate of the device in which the getter is mounted. By reheating the getter material, a process called reactivation, it is possible to restore the pumping efficiency of the getter. Such reactivation is performed by heating the material at a temperature slightly below or equal to the activation temperature—for example, 800–900 degrees C. The time necessary for reactivation is usually shorter than for activation. Such non-evaporable porous getters can be reactivated several times. Such non-evaporable getters as described, are capable of pumping an ultra high vacuum source enclosure of the dimensions illustrated with suppressed outgassing characteristics to ultra high vacuum levels in the range of $10^{-9}$ to $10^{-10}$ Torr and maintaining such vacuum levels for hundreds of hours without reactivation. This could represent a year's operation in normal use.

Filament conductors 116, 118 are electrically joined to and support the filament 38.

The electrode assembly 40 is illustrated as comprising an extraction electrode 120, a focus electrode 122 and the anode electrode 43. Extraction electrode 120 is excited through one of the pins of connector 26 and feed-through 30. Focus electrode 122 is excited through another of the connector 26 pins and feed-through 28. The electrode assembly 40 is anchored to the base plate 70 by means of an anode nut 126 which is threaded on a portion of the focus electrode which extends through an opening in the base plate 70.

A beam of electrons drawn from the tip 36 by extraction electrode 120 passes through apertures in the extraction electrode 120, focus electrode 122 and anode electrode 43 and is brought to a focus at the differential pressure aperture 42.

For optimum performance of the gun, for consistent results by a given gun, and for uniform results from gun to gun in production, it is of extreme importance that the spacing of electrodes 120, 122 and 43, their axial alignnment and parallelism must be maintained with an extremely high degree of precision. For example, the spacing of the extraction and focus electrodes 120, 122 may have a spacing of 0.1 inches with a tolerance of plus or minus 0.0001 inches. The spacing between the focus electrode 122 and the anode electrode 43 may, for example, be 0.15 inches with a tolerance of plus or minus 0.0001 inches.

The axial alignment of electrodes is preferably held to a tolerance of plus or minus 0.0001 inches. Parallelism of the electrodes is preferably held to within 0.1 milliradians.

During the assembly and testing of a gun of the character described, it may be necessary to disassemble and reassemble the electrode assembly a number of times. In accordance with the invention the electrodes 120, 122 and 43 may be reassembled repeatably with a high degree of precision and without undue labor or other costs. Using prior techniques, this has not been possible.

Following the invention of co-pending application Ser. No. 508,293, three precision electrode spheres are located between the extraction electrode 120 and the focus electrode 122. The spheres 128, one of which is shown, are azimuthally separated around the beam axis. The spheres make repeatable and accurate spacing and alignment of the extraction and focus electrodes 120, 122 readily achievable. In a preferred embodiment, the spheres are three in number and are azimuthally spaced around the axis by 120 degrees.

Figure 5:
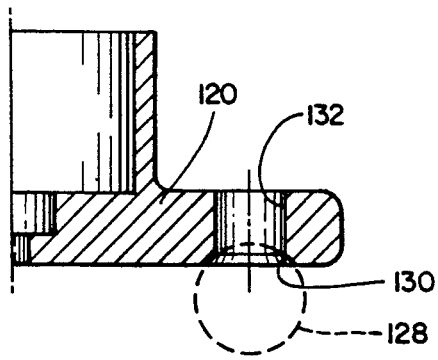
Figure 6:
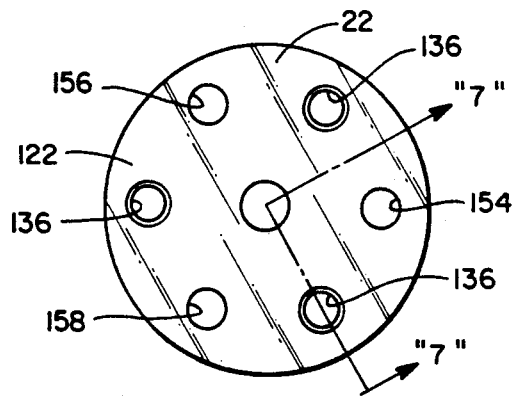
FIGS. 6 and 7 are plan and partial section views of a focus electrode comprising part of the FIGS. 1A-3 gun assembly.

The spheres 128 are preferably composed of sapphire. They are commercially available with extreme precision in various diameters. As shown in FIG. 5, the spheres 128 are each seated in a chamfer 130 in a through hole 132 in the extraction electrode 120. The chamfer 130 assists in seating the spheres 128 and in accurately positioning them between the electrodes 120, 122.

Figure 7:
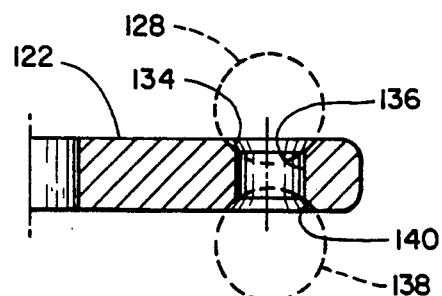
Figure 8:
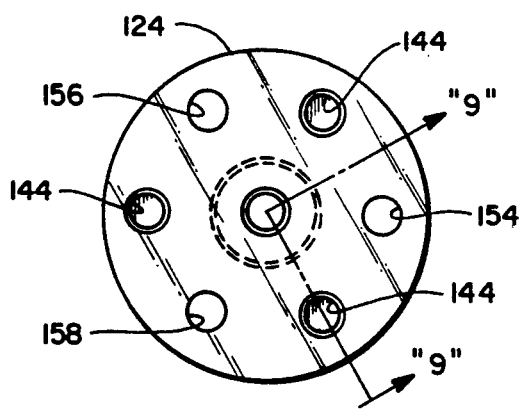
FIGS. 8-9 are plan and partial section views of an anode electrode comprising part of the FIGS. 1A-3 gun assembly.
Figure 9:
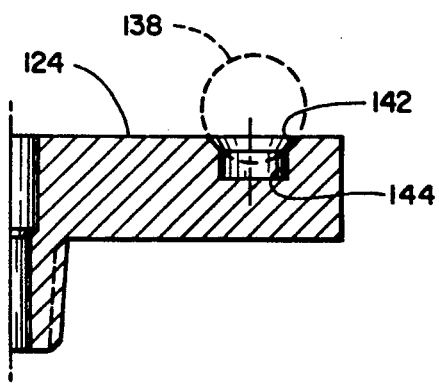

As shown in FIG. 7, the focus electrode 122 has a chamfer 134 in a through hole 136 on the side of the electrode 122 facing the extraction electrode 120.

With three spheres located in the sets of three holes 132, 136 in the extraction and focus electrodes 120, 122, the elecctrodes 120, 122 are repeatably positioned relative to each other with extreme accuracy in axial spacing and alignment. With the three spheres in place, the electrodes 120, 122 assume a unique spatial relationship with respect to each other which is accurate to within 0.0001 inch, assuming the spheres 128 to have a diameter accuracy of plus or minus 0.00005 inch. Since the precision spheres 128 are extremely uniform in diameter, it is not necessary to assign a given sphere to a given hole in order to achieve extreme spacing and axial alignment accuracies upon disassembly and reassembly of the electrodes 120, 122.

Following the same principles, a second set of spheres 138 is positioned between the focus electrode 122 and the anode electrode 43. The spheres are received in holes 136, 144 having chamfers 140, 142.

To hold the assembly of electrodes 120, 122, and 124 and spheres 128, 138 together, it is preferred to use a set of three, 120-degree-spaced posts 146, one of which is shown. The posts 146 each comprise a slotted head 148 and a threaded distal end 150, between which is an insulative section 152, preferably composed of sapphire. The threaded end 150 is screwed into a threaded opening in the base plate 70 to secure the electrode assembly 40 thereto. The posts 146 are received in 120-degree-spaced post holes in the electrodes 120, 122, 124. The post holes in electrode 120, for example, are shown at 154, 156 and 158. The three sets of axially aligned holes 154, 156 and 158 are angularly separated from the sphere-receiving holes to prevent interference between the posts 146 and the spheres 128, 138.

It is an object of the present invention to provide in or for a differential pressure electron beam system, an improved electron source of the general character described in U.S. Pat. No. 4,833,362 having an ultra high vacuum cathode and a passive pumping means—preferably a non-evaporable getter. In particular, it is an object to provide such a source whose cathode life is enhanced by the removal of gases not absorbed, or not absorbed efficiently, by the non-evaporable getter.

The electron beam system of the present invention includes means defining a vacuum enclosure. A source of electrons is located within the vacuum enclosure. Passive pumping means located within or in communication with the enclosure is provided for pumping gases from the enclosure. A supplemental active pumping means coupled to the vacuum enclosure and functioning simultaneously with the passive pumping means pumps from the enclosure gases not removed, or not removed efficiently from the enclosure by the passive pumping means.

As shown specifically in FIGS. 1 and 1A, the electron beam system, according to a preferred execution of the present invention, includes an active pumping means in the form of an appendage pump 19.

The appendage pump may have, in the illustrated embodiment, a pumping capacity of 2 liters per second and is preferably of the type known as an "ion pump".

The provision of complementary active pumping means (getter 98 in the illustrated embodiment) and passive pumping means (appendage pump 19 in the illustrated embodiment) has a number of significant benefits. Getter 98 is very effective in removing ambient gases such as hydrogen, oxygen, nitrogen and water vapor. In the illustrated embodiment, using a getter of the type described, the ultra high vacuum enclosure is typically pumped to a vacuum of $10^{-9}$ Torr.

However, the getter 98 is not effective, or not efficient, in removing gases such as hydrocarbons and argon. The presence of such gases prevents attainment of lower pressures in the ultra high vacuum enclosure, reducing the life of the field emission cathode.

Further, the presence of hydrocarbons can poison the surface of the getter, causing it to cease pumping entirely. The presence of argon can significantly reduce the life of the field emission source.

By the provision of both getter 98 and appendage pump 19, high vacuum levels are achieved, prolonging cathode life, and the deleterious effect of hydrocarbons and inert gases such as argon are avoided.

The following claims are intended not only to cover the illustrative structure and methods described, but other structures and methods which utilize the teachings of the present invention and are within the spirit and scope of the invention.

What is claimed is:

1. A differential pressure electron beam system, comprising:
    system vacuum enclosure means defining a system vacuum enclosure;
    means for evacuating said system vacuum enclosure to a predetermined vacuum level; and
    a modular encapsulated high brightness source of electrons comprising:
        source vacuum enclosure means defining a source vacuum enclosure, said source vacuum enclosure means defining a differential pressure aperture communicating with said system vacuum enclosure,
        a high brightness cathode within said source vacuum enclosure requiring an ultra high vacuum environment for efficient operation,
        non-evaporable getter means located within said source vacuum enclosure and immediately adjacent said high brightness cathode for pumping said source enclosure to an ultra high vacuum level, and
        supplemental ion pump means coupled to said source vacuum enclosure and functioning simultaneously with said non-evaporable getter means for pumping from said source vacuum enclosure argon, hydrocarbons and other gases not removed, or not removed efficiently, therefrom by said non-evaporable getter means.

2. The system defined by claim 1 wherein said high brightness source is a field emitter cathode having a filament supporting a tip and wherein said non-evaporable getter means is a toroidal non-evaporable porous getter surrounding said filament adjacent said tip.

3. A differential pressure electron beam system, comprising:
    system vacuum enclosure means defining a system vacuum enclosure including a specimen chamber;
    means for evacuating said system vacuum enclosure to a predetermined vacuum level; and
    a modular encapsulated high brightness source of electrons comprising:
        source vacuum enclosure means defining a source vacuum enclosure, said source vacuum enclosure means defining a differential pressure aperture communicating with said system vacuum enclosure when said source vacuum enclosure means is coupled to said system vacuum enclosure means,
        a field emitter cathode within said source vacuum enclosure requiring an ultra high vacuum environment for efficient operation, said field emitter cathode including a filament and a field-emission tip,
        toroidally shaped non-evaporable porous getter means located within said source vacuum enclosure and surrounding said filament adjacent said tip for passively pumping said source vacuum enclosure to an ultra high vacuum level, and
        ion appendage pumping means coupled to said source vacuum enclosure and functioning simultaneously with said non-evaporable porous getter means for pumping from said source enclosure argon, hydrocarbons and other gases not removed, or not removed efficiently, therefrom by said non-evaporable porous getter means.

* * * * *